US008220947B2

(12) United States Patent
Arai et al.

(10) Patent No.: US 8,220,947 B2
(45) Date of Patent: Jul. 17, 2012

(54) DIFFERENTIAL DRIVER CIRCUIT

(75) Inventors: Yasuyuki Arai, Tokyo (JP); Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 14 days.

(21) Appl. No.: 13/002,975

(22) PCT Filed: Oct. 14, 2009

(86) PCT No.: PCT/JP2009/005341
§ 371 (c)(1),
(2), (4) Date: Jan. 6, 2011

(87) PCT Pub. No.: WO2011/045832
PCT Pub. Date: Apr. 21, 2011

(65) Prior Publication Data
US 2011/0234317 A1    Sep. 29, 2011

(51) Int. Cl.
*H03K 19/086* (2006.01)
(52) U.S. Cl. ........ 362/127; 326/121; 326/115; 326/112; 326/82
(58) Field of Classification Search ............. 326/56–59, 326/81, 82, 86, 112, 115, 121, 126, 127; 327/108–112
See application file for complete search history.

(56) References Cited

U.S. PATENT DOCUMENTS

| 6,794,907 | B2 | 9/2004 | Choi | 326/127 |
|---|---|---|---|---|
| 6,897,685 | B2* | 5/2005 | Sato | 326/86 |
| 7,180,310 | B2 | 2/2007 | Sasajima | 324/716 |
| 7,298,173 | B1* | 11/2007 | Jiang et al. | 326/83 |
| 7,683,656 | B1* | 3/2010 | Ho | 326/21 |
| 7,719,314 | B1* | 5/2010 | Jiang et al. | 326/83 |
| 7,969,195 | B1* | 6/2011 | Fortin et al. | 326/83 |
| 8,030,968 | B1* | 10/2011 | Avner et al. | 326/85 |
| 8,041,552 | B2* | 10/2011 | Pilling | 703/14 |
| 2008/0218222 | A1* | 9/2008 | Nishi | 327/108 |

FOREIGN PATENT DOCUMENTS

| JP | 07-94980 A | 4/1995 |
|---|---|---|
| JP | 09-294062 A | 11/1997 |
| JP | 2004-215035 A | 7/2004 |
| JP | 2007-158810 A | 6/2007 |
| JP | 2008-514036 A | 5/2008 |
| WO | 2006/046399 A1 | 5/2006 |

OTHER PUBLICATIONS

PCT International Search Report and Written Opinion issued in PCT Application No. PCT/JP2009/005341 mailed on Jan. 12, 2010, with its English-language translations.

* cited by examiner

*Primary Examiner* — Vibol Tan
(74) *Attorney, Agent, or Firm* — Ladas & Parry, LLP

(57) ABSTRACT

A first current source supplies a tail current It to a plurality of differential pairs. A pre-driver outputs gate signals to the gates of transistors of the corresponding differential pair. A pre-driver is configured to switch the state between the enable state and the disable state. In the enable state, the pre-driver outputs the gate signals that correspond to the differential signals. In the disable state, the pre-driver outputs the gate signals having levels which instruct the transistors of the corresponding differential pair to switch off.

12 Claims, 13 Drawing Sheets

FIG.10A

DRE=0

|  |  | VTT |  | PAT | | | | | | DRE | |
|---|---|---|---|---|---|---|---|---|---|---|---|
|  |  |  |  | 1 | 1x | 2 | 2x | 3 | 3x | 1 | 1x |
| Dnum1=1 | 1 | $VTT_1$>VIH | (VH=VTT) | H | L | L | L | L | L | H | L |
|  | 2 | VIH>$VTT_2$>VIL | (VH=VIH) | H | L | L | L | L | L | L | H |
|  | 3 | VIL>$VTT_3$ | (VH=VIH) | L | H | L | L | L | L | L | H |
| Dnum2=1 | 4 | $VTT_4$>VIH |  | H | L | H | L | L | L | H | L |
|  | 5 | VIH>$VTT_5$>VILDr1 |  | H | L | H | L | L | L | L | H |
|  | 6 | VILDr1>$VTT_6$>VIL |  | L | H | H | L | L | L | L | H |
|  | 7 | VIL>$VTT_7$ |  | L | H | L | H | L | L | L | H |
| Dnum3=1 | 8 | $VTT_8$>VIH |  | H | L | H | L | H | L | H | L |
|  | 9 | VIH>$VTT_9$>VILDr1 |  | H | L | H | L | H | L | L | H |
|  | 10 | VILDr1>$VTT_{10}$>VILDr2 |  | L | H | H | L | H | L | L | H |
|  | 11 | VILDr2>$VTT_{11}$>VIL |  | L | H | L | H | H | L | L | H |
|  | 12 | VIL>$VTT_{12}$ |  | L | H | L | H | L | H | L | H |

FIG.10B

DRE=1

|  |  | VTT |  | PAT | | | | | | DRE | |
|---|---|---|---|---|---|---|---|---|---|---|---|
|  |  |  |  | 1 | 1x | 2 | 2x | 3 | 3x | 1 | 1x |
| Dnum1=1 | 1 | $VTT_1$>VIH | (VH=VTT) | P | Px | L | L | L | L | L | H |
|  | 2 | VIH>$VTT_2$>VIL | (VH=VIH) | P | Px | L | L | L | L | H | L |
|  | 3 | VIL>$VTT_3$ | (VH=VIH) | P | Px | L | L | L | L | H | L |
| Dnum2=1 | 4 | $VTT_4$>VIH |  | P | Px | P | Px | L | L | L | H |
|  | 5 | VIH>$VTT_5$>VILDr1 |  | P | Px | P | Px | L | L | H | L |
|  | 6 | VILDr1>$VTT_6$>VIL |  | P | Px | P | Px | L | L | H | L |
|  | 7 | VIL>$VTT_7$ |  | P | Px | P | Px | L | L | H | L |
| Dnum3=1 | 8 | $VTT_8$>VIH |  | P | Px | P | Px | P | Px | L | H |
|  | 9 | VIH>$VTT_9$>VILDr1 |  | P | Px | P | Px | P | Px | H | L |
|  | 10 | VILDr1>$VTT_{10}$>VILDr2 |  | P | Px | P | Px | P | Px | H | L |
|  | 11 | VILDr2>$VTT_{11}$>VIL |  | P | Px | P | Px | P | Px | H | L |
|  | 12 | VIL>$VTT_{12}$ |  | P | Px | P | Px | P | Px | H | L |

※ P=PAT, Px=PATx

DIFFERENTIAL DRIVER CIRCUIT

CROSS REFERENCE TO RELATED APPLICATIONS

This application is the U.S. National Stage of International Patent Application No. PCT/JP2009/005341 filed on Oct. 14, 2009 and claims priority thereto, the disclosure of which is hereby incorporated by reference in its entirety.

BACKGROUND OF THE INVENTION

1. Field of the Invention

The present invention relates to a differential driver circuit configured to output a differential signal via a transmission line.

2. Description of the Related Art

In order to provide high-speed data communication between multiple semiconductor devices, differential data transmission such as CML (Current Mode Logic) or LVDS (Low Voltage Differential Signaling) is employed. A differential driver circuit configured to output a differential signal to a semiconductor device is mounted on a test apparatus configured to test a semiconductor device including a differential interface used to perform differential data transmission.

RELATED ART DOCUMENTS

U.S. Pat. No. 7,180,310 B2 specification
U.S. Pat. No. 6,794,907 B2 specification There is a demand for a general purpose test apparatus for supporting various devices under test (which will also be referred to as "DUTs" hereafter) that conform to various standards. Accordingly, there is a demand for a general purpose differential driver circuit mounted on the test apparatus. Specifically, the differential driver circuit employed in the test apparatus preferably allows the amplitude of a differential signal to be adjusted as desired according to the kind of DUT to be tested, the kind of test, etc.

SUMMARY OF THE INVENTION

The present invention has been made in view of such a situation. Accordingly, it is an exemplary purpose of the present invention to provide a differential driver circuit which is capable of switching the amplitude.

An embodiment of the present invention relates to a differential driver circuit configured to output a differential signal to a differential transmission line. The differential driver circuit comprises: a first output terminal connected to one side of the differential transmission line; a second output terminal connected to the other side of the differential transmission line; a first resistor arranged such that a predetermined voltage is received via one terminal thereof, and the other terminal thereof is connected to the first output terminal; a second resistor arranged such that a predetermined voltage is received via one terminal thereof, and the other terminal thereof is connected to the second output terminal; multiple differential pairs; multiple first current sources; and multiple pre-drivers. Each differential pair comprises a first transistor and a second transistor arranged such that the sources thereof are connected to each other, a drain of the first transistor is connected to the first output terminal and one side of a differential signal to be transmitted is input to a gate of the first transistor, and a drain of the second transistor is connected to the second output terminal and the other side of the differential signal to be transmitted is input to a gate of the second transistor. The multiple first current sources are severally arranged according to multiple respective differential pairs, and are each configured to supply a tail current to the corresponding differential pair. The multiple pre-drivers are severally arranged according to the multiple respective differential pairs, and are each configured to output gate signals to the gates of the first and second transistors of the corresponding differential pair. The multiple pre-drivers are each configured to independently switch between an enable state and a disable state, to output, in the enable state, the gate signals according to the differential signal, and to output, in the disable state, gate signals having levels which instruct the first and second transistors of the corresponding differential pair to switch off.

A differential driver circuit according to another embodiment of the present invention also relates to a differential driver circuit. The differential driver circuit includes a first current source arranged as a shared current source for the multiple differential pairs, instead of the above-described first current sources severally arranged according to multiple respective differential pairs.

The differential driver circuit according to any one of the above-described embodiments is capable of switching the amplitude of the differential signal in a stepwise manner.

It should be noted that any combination of the aforementioned components may be made, and any component of the present invention or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 10A and 10B are tables showing the level of the signal generated by the pre-driver control unit in the first mode and the second mode, respectively;

DETAILED DESCRIPTION OF THE INVENTION

Figure 1:
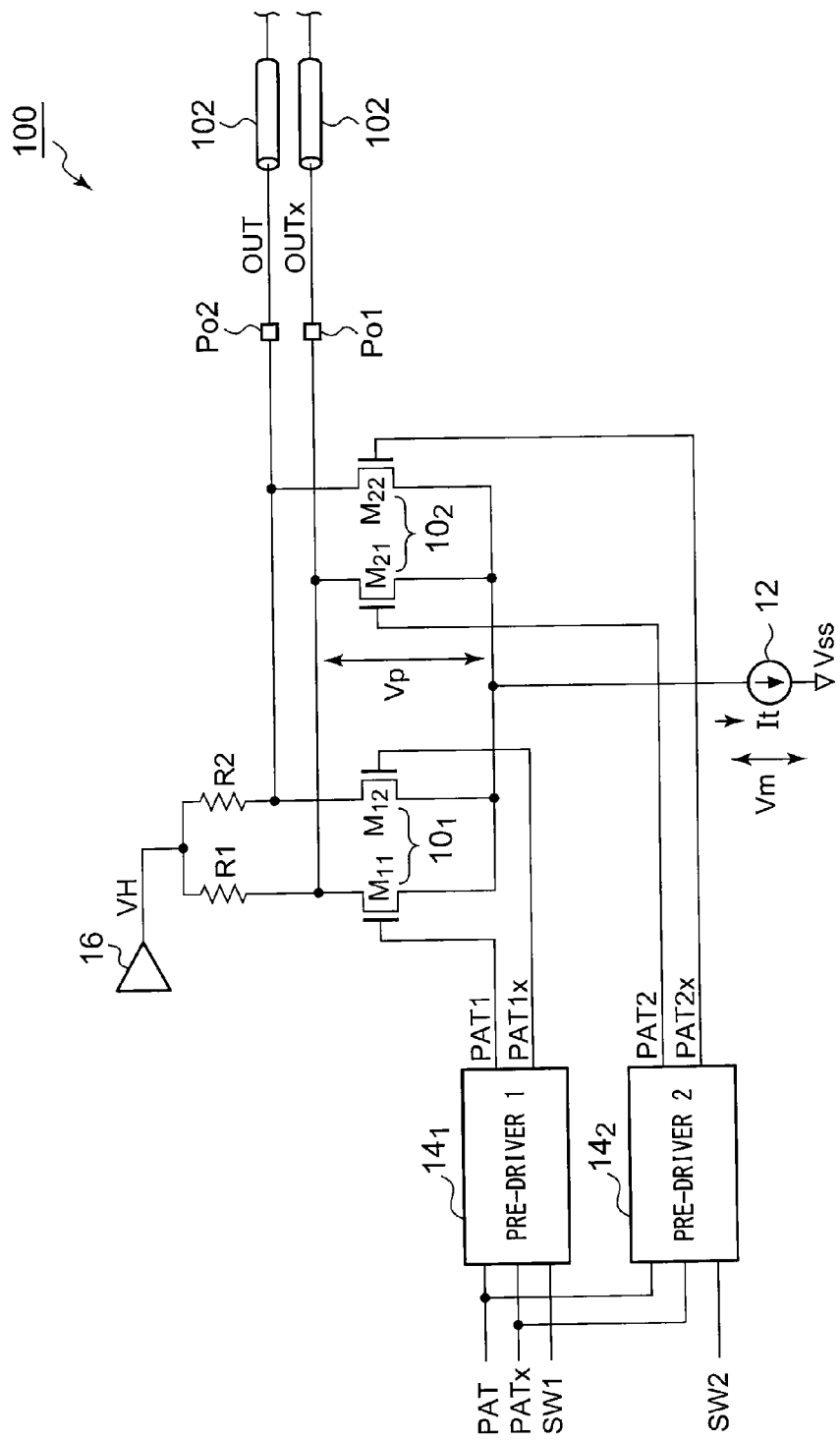
FIG. 1 is a circuit diagram which shows a configuration of a differential driver circuit according to an embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

FIG. 1 is a circuit diagram which shows a configuration of a differential driver circuit 100 according to an embodiment. The differential driver circuit 100 receives differential pattern signals PAT and PATx transmitted in a complementary manner, generates differential output signals OUT and OUTx that correspond to the differential pattern signals PAT and PATx thus received, and outputs the output signals thus generated to a differential transmission line 102. It is a feature of the differential driver circuit 100 that it is configured such that the amplitudes of the differential output signals OUT and OUTx can be adjusted according to a control signal SW. The differential pattern signals PAT and PATx are each set to a level 1 (high level) or a level 0 (low level) in a complementary manner.

The differential driver circuit 100 includes a first output terminal Po1, a second output terminal Po2, a first resistor R1, a second resistor R2, multiple (n) differential pairs $10_1$ through $10_n$, a first current source 12, multiple (n) pre-drivers $14_1$ through $14_n$, and a first voltage source 16. To facilitate understanding and for simplicity of explanation, FIG. 1 shows an arrangement in which n=2. However, the present invention is not restricted to such an arrangement. Also, the present invention can be applied to an arrangement in which n is set to a desired integer n, as described later with reference to FIG. 5.

The first output terminal Po1 is connected to one side of the differential transmission line 102. The second output terminal Po2 is connected to the other side of the differential transmission line 102. A predetermined voltage VH is applied to one terminal of the first resistor R1, and the other terminal thereof is connected to the first output terminal Po1. Furthermore, the predetermined voltage VH is applied to one terminal of the second resistor R2, and the other terminal thereof is connected to the second output terminal Po2. The first voltage source 16 generates the voltage VH.

The multiple differential pairs $10_1$ and $10_2$ each include a first transistor $M_{i1}$ and a second transistor $M_{i2}$ arranged such that the sources thereof are connected to each other. The index i ($1 \leq i \leq M$) represents the differential pair to which the corresponding transistor belongs. The transistors $M_{i1}$ and $M_{i2}$ are each configured as a MOSFET (Metal Oxide Semiconductor Field Effect Transistor). The transistors $M_{i1}$ and $M_{i2}$ that form a differential pair are the same size. That is to say, the transistors $M_{i1}$ and $M_{i2}$ have the same W/L (gate width/gate length).

The drain of the first transistor $M_{i1}$ is connected to the first output terminal Po1. One side PATi of the differential signal to be transmitted is input to the gate of the first transistor $M_{i1}$. The drain of the second transistor $M_{i1}$ is connected to the second output terminal Po2. The other side PATix of the differential signal to be transmitted is input to the gate of the second transistor $M_{i2}$.

The first current source is connected as a shared current source to the sources of both the first transistor $M_{i1}$ and the second transistor $M_{i2}$ of all the differential pairs $10_1$ and $10_2$. The first current source 12 supplies a tail current It.

Multiple pre-drivers $14_1$ and $14_2$ are provided to respective multiple differential pairs $10_1$ and $10_2$. The i-th pre-driver $14_i$ supplies gate signals PATi and PATix to the respective gates of the first transistor $M_{i1}$ and the second transistor $M_{i2}$ that form the corresponding differential pair $10_i$. The multiple pre-drivers $14_1$ and $14_2$ are each configured such that the state can be independently and selectively switched between the enable (active) state and the disable (inactive) state. In the enable state, the pre-driver $14_i$ outputs the gate signals PATi and PATix that correspond to the differential signal PAT/PATx to be transmitted. That is to say, in the enable state, the gate signals PATi and PATix have levels which are switched in a complementary manner.

On the other hand, in the disable state, the pre-driver $14_1$ outputs the gate signals PATi and PATix having a level that instructs the first transistor $M_{i1}$ and the second transistor $M_{i2}$ that form the corresponding differential pair $10_i$ to switch off. With such an arrangement, the gate signals PATi and PATix to be set in the disable state may be designed to be the same level.

The multiple pre-drivers $14_1$ and $14_2$ are switched between the enable state and the disable state according to the control signals SW. In the present embodiment, the control signals SW include multiple control signals SW1 through SW2 which are associated with the respective multiple pre-drivers $14_1$ and $14_2$. When the corresponding control signal SWi is asserted (e.g., high level: 1), the i-th pre-driver $14_1$ is enabled. When the corresponding control signal SWi is negated (e.g., low level: 0), the i-th pre-driver $14_i$ is disabled.

Figure 2:
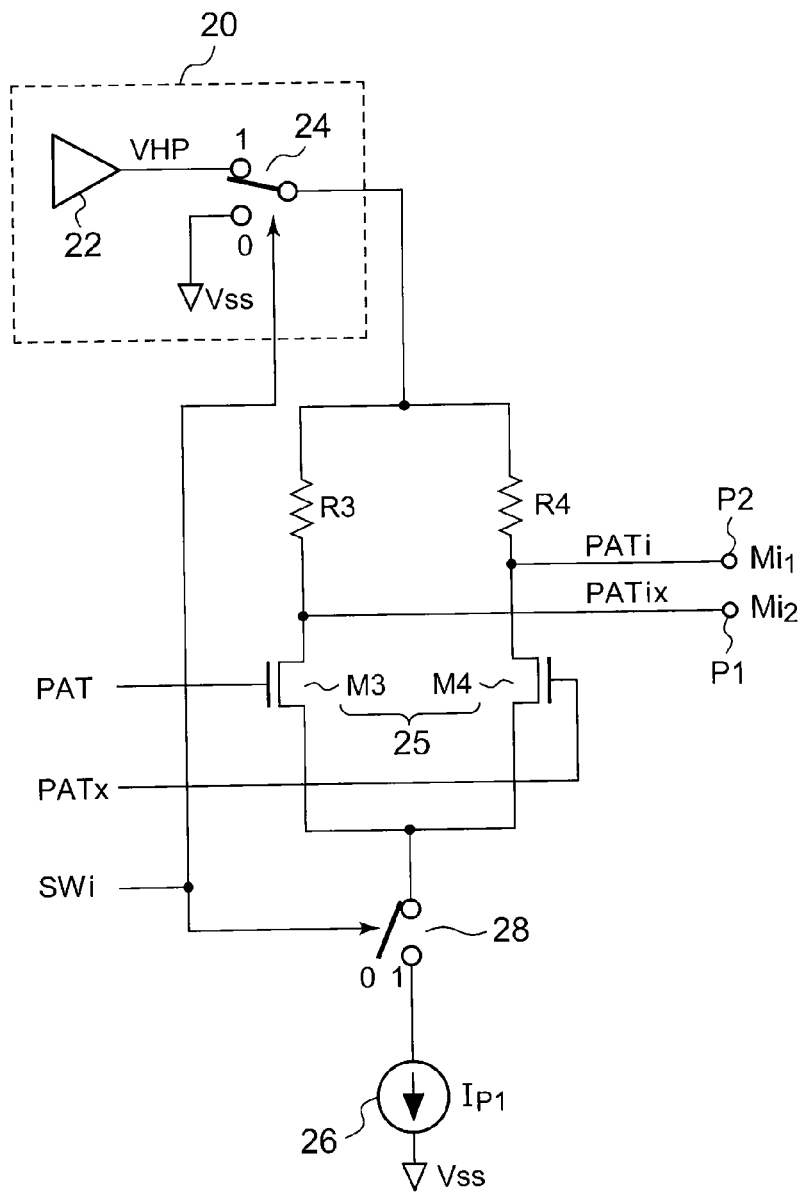
FIG. 2 is a circuit diagram which shows a configuration of a pre-driver shown in FIG. 1.

FIG. 2 is a circuit diagram which shows a configuration of the pre-driver 14 shown in FIG. 1. The pre-driver 14 is a differential amplifier including a first terminal P1, a second terminal P2, a second voltage source 20, a third resistor R3, a fourth resistor R4, a third transistor M3, and a fourth transistor M4.

The first terminal P1 is connected to the gate (not shown) of the first transistor $M_{i1}$ of the corresponding differential pair $10_i$. The second terminal P2 is connected to the gate (not shown) of the second transistor $M_{i2}$ of the corresponding differential pair $10_i$. The second voltage source 20 generates a voltage the value of which can be switched between two voltage values.

The voltage output from the second voltage source 20 is applied to one terminal of the third resistor R3. The other terminal of the third resistor R3 is connected to the first terminal P1. The voltage output from the second voltage source 20 is applied to one terminal of the fourth resistor R4. The other terminal of the fourth resistor R4 is connected to the second terminal P2.

The drain of the third transistor M3 is connected to the first terminal P1. One side PAT of the differential signal to be transmitted is input to the gate of the third transistor M3. The drain of the fourth transistor M4 is connected to the second terminal P2. The other side PATx of the differential signal to be transmitted is input to the gate of the fourth transistor M4. The third transistor M3 and the fourth transistor M4 are arranged such that the sources thereof are connected to each other.

The second current source 26 supplies a tail current $I_{p1}$ to a differential pair 25 formed of the third transistor M3 and the fourth transistor M4. In the enable state, a switch 28 allows the tail current $I_{p1}$ to pass. In the disable state, the switch cuts off the tail current $I_{p1}$.

The second voltage source 20 is configured to output a predetermined voltage VHP in the enable state, and to output a voltage (e.g., the ground voltage Vss) which instructs the first and second transistors (not shown) of the corresponding differential pair $10_i$ to switch off in the disable state.

Specifically, the second voltage source 20 includes an amplifier 22 and a switch 24. The amplifier 22 generates a predetermined voltage VHP. The predetermined voltage VHP is input to a first input terminal (1) of the switch 24. The ground voltage Vss is input to a second input terminal (0) thereof. When the control signal SWi is asserted (set to high level), the switch 24 turns on the first input terminal (1) side. When the control signal SWi is negated (set to low level), the switch 24 turns on the second input terminal (0) side.

With the pre-driver $14_i$, when the control signal SWi is asserted, the predetermined voltage VHP is applied to one terminal of each of the third resistor R3 and the fourth resistor R4, and the switch 28 is turned on, thereby supplying the tail current $I_{p1}$ to the differential pair 25 formed of the third transistor M3 and the fourth transistor M4. In this state, the pre-driver $14_i$ outputs the gate signals PATi and PATix according to the differential pattern signal PATi/PATix.

When the control signal SWi is negated, the switch 28 is turned off, and the tail current $I_{p1}$ is cut off, whereby the electric potentials at the first terminal P1 and the second terminal P2, i.e., the gate signals PATi and PATix, are fixed to the ground voltage Vss. As a result, the first transistor $M_{i1}$ and the second transistor $M_{i2}$ that form the differential pair $10_i$, which is supplied with the gate signals PATi and PATix, are both turned off.

It should be noted that FIG. 2 shows a desirable example configuration of the pre-driver 14. The configuration of the pre-driver 14 is not restricted to such a configuration shown in FIG. 2.

Figure 3:
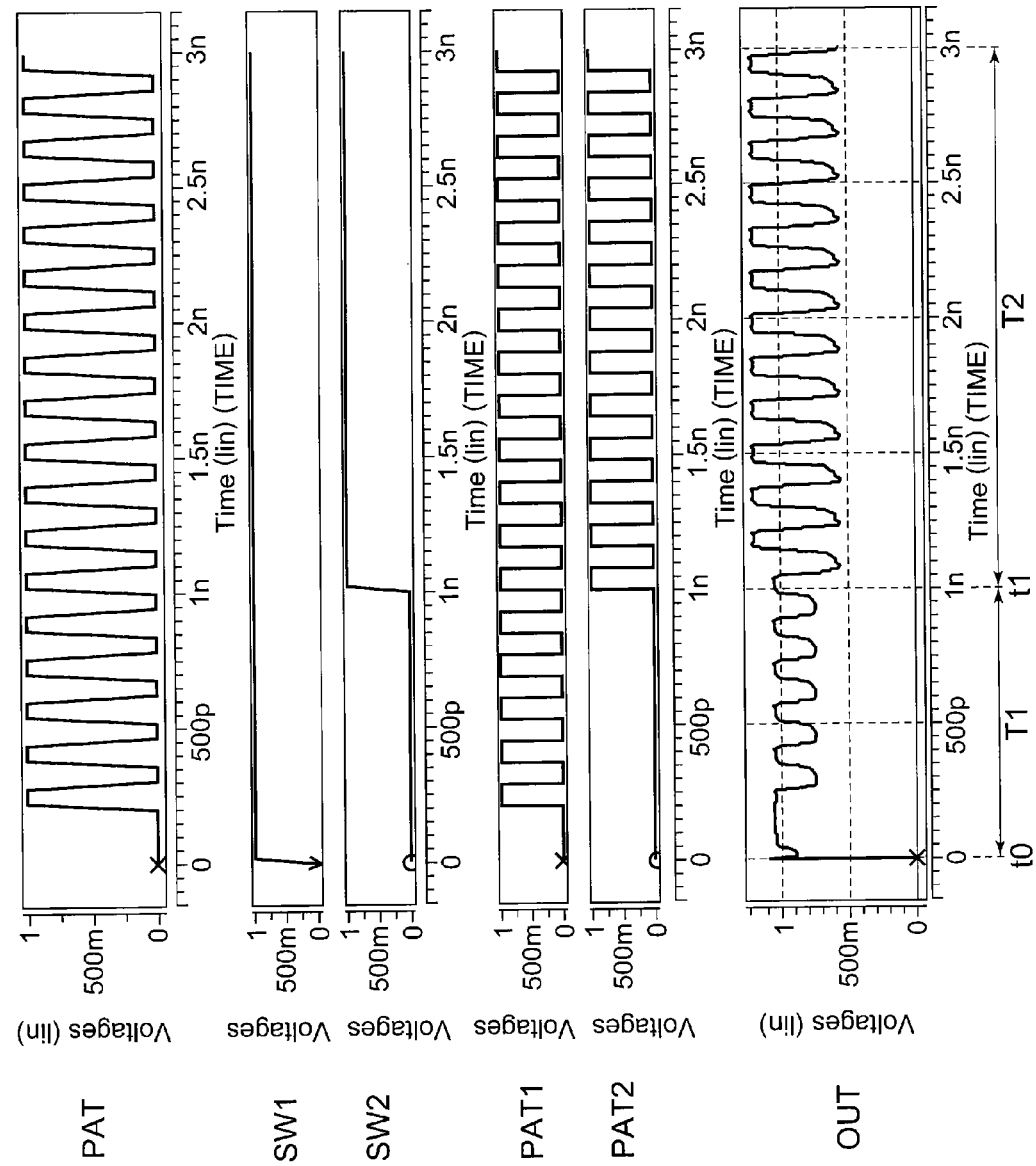
FIG. 3 is a waveform diagram which shows the operation of the differential driver circuit shown in FIG. 1.

Description has been made regarding the configuration of the differential driver circuit 100. Next, description will be made regarding the operation of the differential driver circuit 100. FIG. 3 is a waveform diagram which shows the operation of the differential driver circuit 100 shown in FIG. 1. It should be noted that only one side of the differential signal is shown, and the other side is omitted, in the waveform diagrams in FIG. 3 and the subsequent drawings.

The differential output of the differential driver circuit 100 is represented by the following Expressions.

$$OUT = VH - R2 \cdot (1 - PAT) \cdot It$$

$$OUTx = VH - R1 \cdot PAT \cdot It$$

When PAT=1, the differential output is represented by the following Expressions.

$$OUT = VIH = VH$$

$$OUTx = VIL = VH - R1 \cdot It$$

When PAT=0, the differential output is represented by the following Expressions.

$$OUT = VIL = VH - R2 \cdot It$$

$$OUTx = VIH = VH$$

With R1=R2=R, the differential output signals OUT and OUTx are each set to one of two voltage levels VIH and VIL represented by the following Expressions (1a) and (1b).

$$VIH = VH \tag{1a}$$

$$VIL = VH - R \cdot It \tag{1b}$$

During a period T1 between the time point t0 and the time point t1, the control signal SW1 is asserted, and the control signal SW2 is negated. That is to say, the pre-driver $14_1$ is set to the enable state, thereby generating the differential gate signal PAT1/PAT1x. Thus, the differential pair $10_1$ performs a switching operation according to the gate signal PAT1. Furthermore, the pre-driver $14_2$ is set to the disable state, thereby fixing the gate signals PAT2 and PAT2x to a level which instructs the first transistor $M_{21}$ and the second transistor $M_{22}$ that form the differential pair $10_2$ to turn off, i.e., to low level (e.g., the ground voltage Vss).

During the period T1, the differential driver circuit 100 is capable of generating a high-speed differential output signal OUT/OUTx according to the pattern signals PAT and PATx. Description will be made below regarding the reason for this.

Figure 4A:
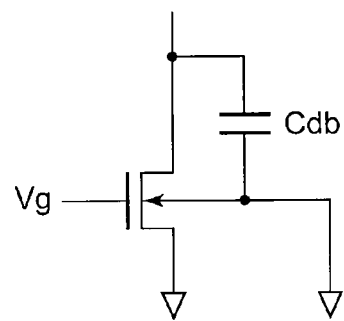
FIG. 4A is an equivalent circuit diagram showing a MOSFET and FIG. 4B is a graph showing a parasitic capacitance that occurs between the drain and the back gate.
Figure 4B:
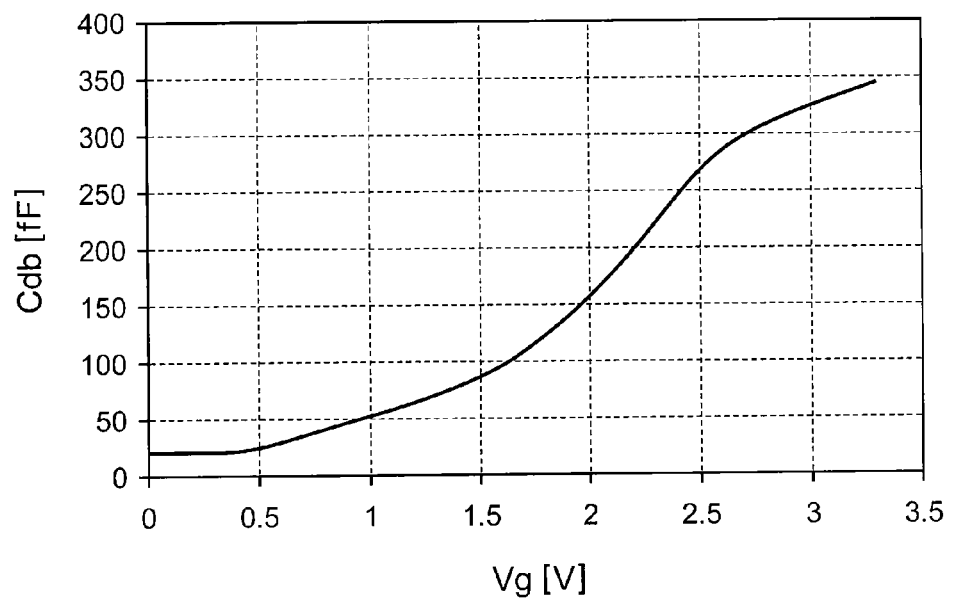

FIGS. 4A and 4B are an equivalent circuit diagram showing a MOSFET and a graph showing the parasitic capacitance that occurs between the drain and the back gate. As shown in FIG. 4A, a parasitic capacitance Cbd occurs between the drain and the back gate of the MOSFET. The parasitic capacitance is coupled to the transmission path of the differential output signal OUT/OUTx. This reduces the bit rate (slew rate) of the differential output signal OUT/OUTx.

As shown in FIG. 4B, the parasitic capacitance Cdb changes depending on the gate voltage Vg. As the gate voltage Vg becomes lower, the parasitic capacitance Cdb becomes smaller. With the embodiment, the pre-driver $14_i$ in the disable state supplies, as the gate signals PATi and PATix for the corresponding differential pair $10_i$, a voltage having a low level which instructs the transistors $M_{i1}$ and $M_{i2}$ to switch off. In this state, such an arrangement reduces the parasitic capacitance that occurs at the differential pair $10_i$ thereby providing a high-speed switching operation for the differential output signal OUT/OUTx. In a case in which the pre-driver $14_i$ supplies the ground voltage Vss as the gate signals PATi and PATix as shown in FIG. 2, the parasitic capacitance Cdb is minimized, thereby providing a high-speed switching speed.

After the time point t1 (during the period T2), both the control signals SW1 and SW2 are asserted. That is to say, both the pre-drivers $14_1$ and $14_2$ are set to the enable state. In this state, the differential pairs $10_1$ and $10_2$ respectively perform a switching operation according to the gate signals PAT1 and PAT1x and the gate signals PAT2 and PAT2x.

During the period T2, as compared with the period T1, the differential driver circuit 100 is capable of generating a high amplitude differential output signal OUT/OUTx. Description will be made below regarding the reason for this.

The AC amplitude ΔV of each of the differential output signals OUT and OUTx is derived as follows from Expression (1a) or (1b).

$$\Delta V = R \times It$$

Here, R represents the resistance value of each of the first resistor R1 and the second resistor R2. Thus, if the tail current It generated by the first current source 12 remains at a constant value during the periods T1 and T2, it can be assumed that the AC amplitude of the differential output signal OUT/OUTx remains at a constant value over the periods T1 and T2.

However, in actuality, the tail current It is not constant over time. The reason for this is as follows. That is to say, when the voltage difference Vm between both terminals of the first current source 12 is sufficiently high, the first current source 12 functions as a constant current source to supply a predetermined tail current It. However, when the voltage Vm drops, the first current source 12 cannot generate such a predetermined tail current It.

During the period T2, the differential pairs $10_1$ and $10_2$ can be seen to form a differential pair (which will be referred to as the "combined differential pair"). The size of a transistor composed of such a combined differential pair is the sum of the sizes of the transistors that form the respective separate differential pairs. Thus, the transistor size of the differential pair which operates in the period T2 is larger than that which operates in the period T1.

If the transistor size of the differential pair is enlarged, the ON resistance of the transistor is reduced, thereby reducing the voltage drop Vp that occurs at the differential pair. Conversely, if the transistor size of the differential pair is reduced, the ON resistance of the transistor is increased, thereby increasing the voltage drop Vp that occurs at the differential pair.

The following relation is satisfied between the voltage drop Vp that occurs at the differential pair and the voltage Vm between both terminals of the first current source 12.

$$Vm = VH - R \times It - Vp$$

Accordingly, as the voltage drop Vp that occurs at the differential pair is increased, the voltage Vm between both terminals of the first current source 12 is reduced. In such a state, MOSFETs (not shown) that form the first current source 12 operate in a zone of saturation, leading to a reduction in the amount of current that can be generated by the first current source 12.

In recent years, reduction in power supply voltages has led to reduction in the voltage VH generated by the first voltage source 16. In this situation, during the period T1 in which the transistor size of the differential pair is small, such an arrangement cannot maintain sufficient voltage Vm between both terminals of the first current source 12. This reduces the tail current It, leading to a state in which the differential output signal OUT/OUTx has a small amplitude. However, in the period T2, the transistor size of the differential pair is relatively large. In this state, such an arrangement maintains sufficient voltage Vm between both the terminals. Thus, the tail current It is increased, thereby allowing the differential output signal OUT/OUTx to have a higher amplitude.

It should be noted that, during the period T2, the size of the transistor coupled to the differential output terminals OUT and OUTx is greater than that in the period T1. Accordingly, the parasitic capacitance Cdb in the period T2 is greater than that in the period T1, leading to a reduced slew rate (which represents the data transmission rate).

As described above, the differential driver circuit 100 shown in FIG. 1 is capable of switching its differential output according to the control signal SW, between differential output with a high slew rate and a low amplitude and differential output with a low slew rate and a high amplitude.

In other words, as can be clearly understood from Expression (1b), the differential driver circuit 100 is capable of switching, according to the control signal SW and in a stepwise manner, the voltage level VIL that corresponds to the low level.

Figure 5:
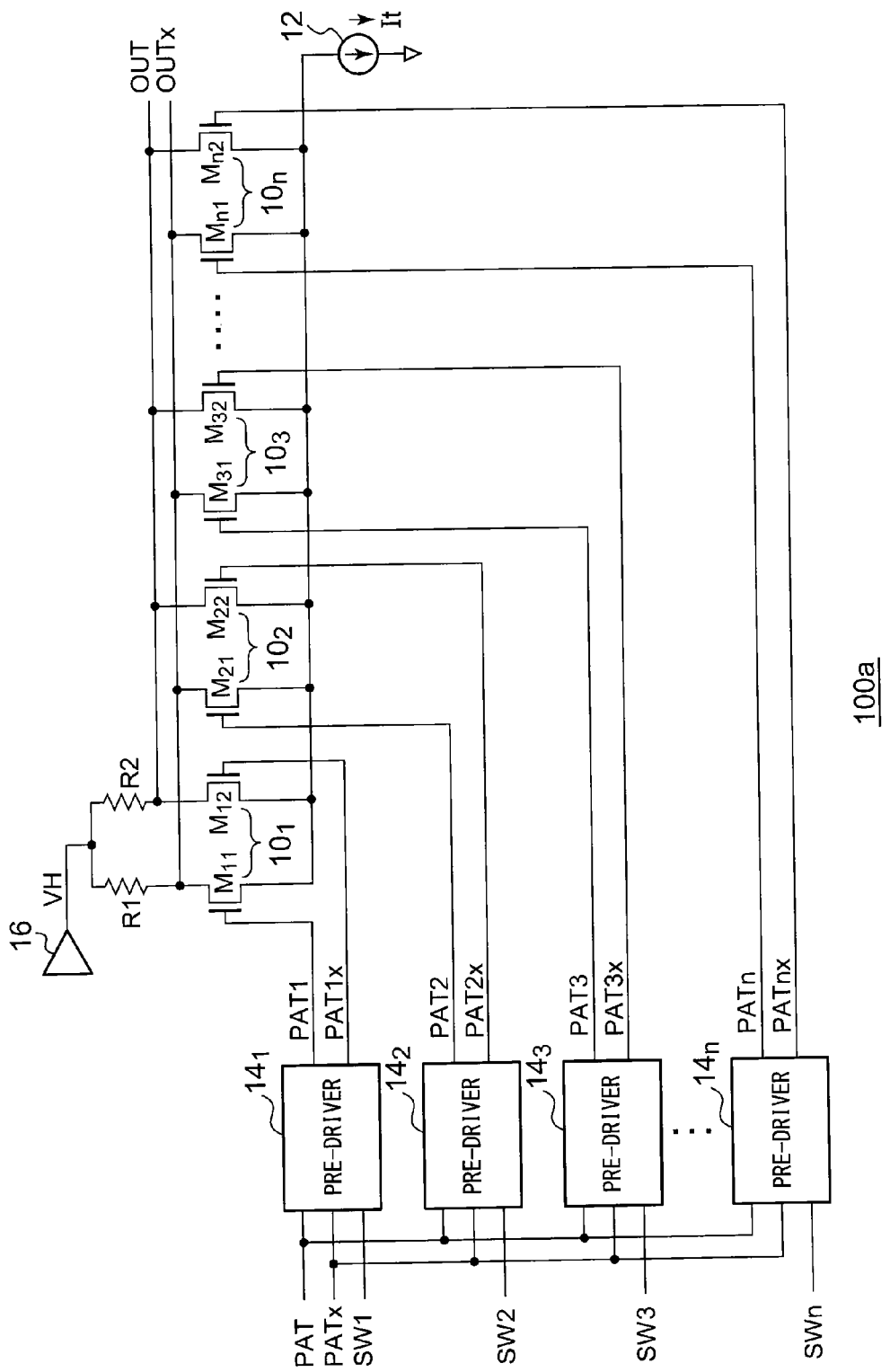
FIG. 5 is a circuit diagram which shows a modification of the differential driver circuit shown in FIG. 1.

FIG. 5 is a circuit diagram which shows a modification of the differential driver circuit shown in FIG. 1. The difference between the differential driver circuit 100 shown in FIG. 1 and the differential driver circuit 100a shown in FIG. 5 is that the differential driver circuit 100a shown in FIG. 5 includes a desired increased number (n) of differential pairs 10. The differential driver circuit 100a shown in FIG. 5 is capable of switching the amplitude and the slew rate of the differential output OUT/OUTx according to control signals SW1 through SWn in a stepwise manner.

With the embodiment, an arrangement may be made employing differential pairs $10_1$ through $10_n$ having the following transistor sizes.

With the transistor sizes of the differential pairs $10_1$ through $10_n$ in the differential driver circuit 100a shown in FIG. 5 as S1 through Sn, the transistor size of the combined differential pair is represented by the Expression $\Sigma_{i=1:n}$ (SWi)×Si. The transistor sizes S1 through Sn may be determined in increments of individual transistors as desired. However, giving consideration to compatibility with a digital control operation, the transistor sizes are preferably established as follows.

All the transistor sizes S1 through Sn may be the same, i.e., S1=S2= . . . =Sn=S, where S represents the unit size. In this case, the size of the combined differential pair is represented by the Expression $\Sigma_{i=1:n}$ (SWi)×S. A so-called thermometer code can be employed as the control signals SW1 through SWn. Also, other codes in which "1" and "0" may be allocated in a random manner or a non-sequential manner can also be employed.

The transistor sizes of the differential pairs $10_1$ through $10_n$ may be weighted in a binary manner. That is to say, with the unit size as S, the size Si of each differential pair $10_i$ is represented by the following Expression.

$$Si = S \times 2^{(i-1)}$$

In this case, the size of the combined differential pair is represented by the Expression $\Sigma_{i=1:n}$ (Si×SWi)=$\Sigma_{i=1:n}$ (S×$2^{(i-1)}$×SWi).

Figure 6:
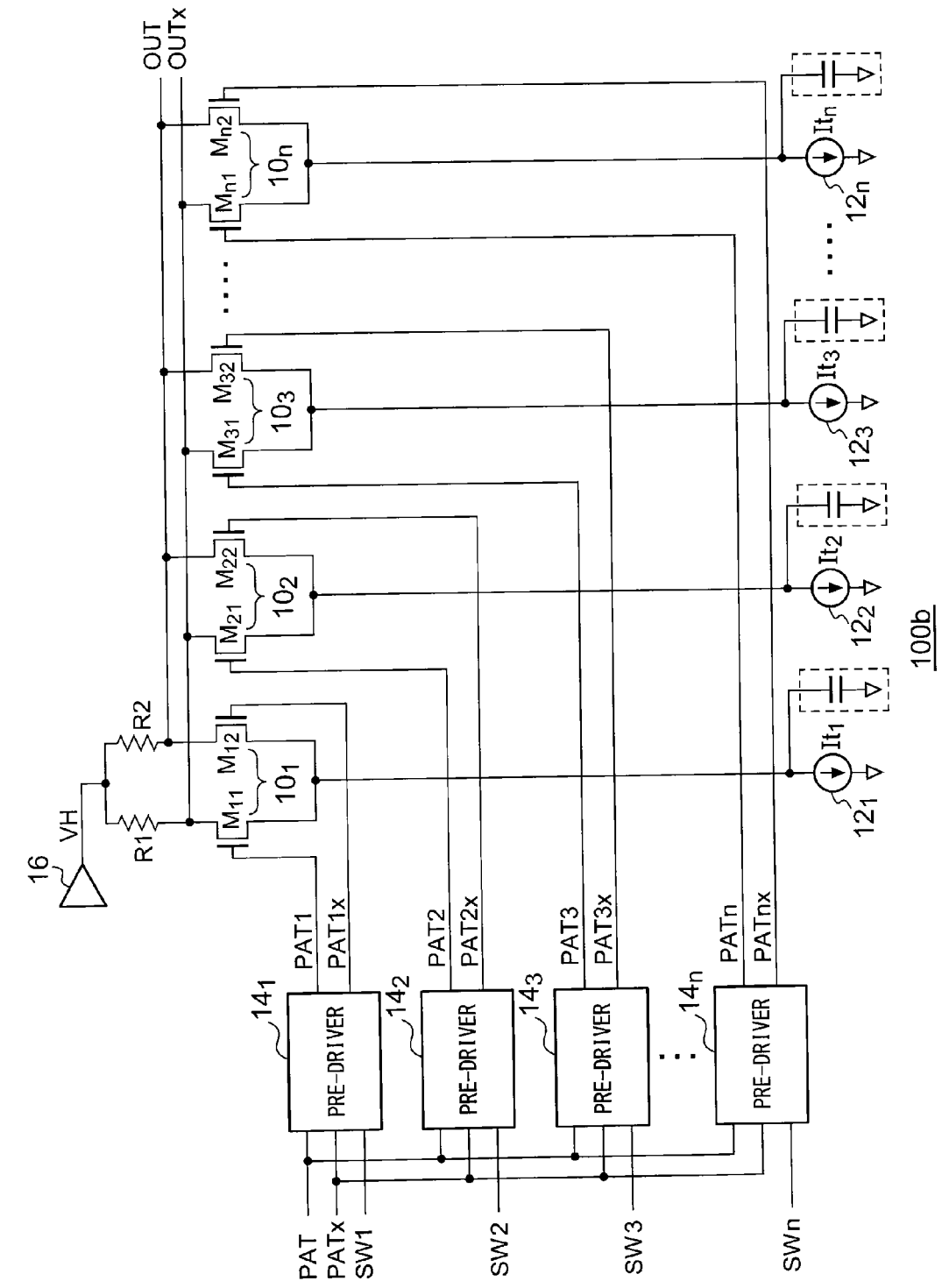
FIG. 6 is a circuit diagram which shows a modification of the differential driver circuit shown in FIG. 5.

FIG. 6 is a circuit diagram which shows a modification of the differential driver circuit shown in FIG. 5. In a differential driver circuit 100b shown in FIG. 6, separate first current sources 12 are provided in increments of the differential pairs $10_1$ through $10_n$. The first current sources $12_1$ through $12_n$ supply respective tail currents $It_1$ through $It_n$ to the corresponding differential pairs $10_1$ through $10_n$.

With the differential driver circuit 100b shown in FIG. 6, the differential output signal OUT/OUTx is represented by the following Expressions.

$$OUT = VH - R2 \cdot (1 - PAT) \cdot \Sigma_{i=1:n}(SWi \cdot It_i)$$

$$OUTx = VH - R1 \cdot PAT \cdot \Sigma_{i=1:n}(SWi \cdot It_i)$$

That is to say, such an arrangement is capable of adjusting the amplitude (low level VIL) in a stepwise manner according to the control signals SW1 through SWn.

Furthermore, compared with the differential driver circuit 100a shown in FIG. 5, the differential driver circuit 100b shown in FIG. 6 has the following advantage.

As shown in FIG. 6, the first current sources $12_1$ through $12_n$ each have a parasitic capacitance. Similarly, the first current source 12 shown in FIG. 5 has an unshown parasitic capacitance. Such a parasitic capacitance reduces the operation speed of the differential pairs 10. Such a configuration shown in FIG. 5 has the same parasitic capacitance regardless of the number of pre-drivers 14 (differential pairs 10) that are in the enable state. In contrast, with such a configuration shown in FIG. 6, the parasitic capacitance changes according to the number of pre-drivers 14 that are in the enable state. Thus, the differential driver circuit 100b shown in FIG. 6 provides higher-speed operation than the differential driver circuit 100a shown in FIG. 5.

Description has been made in the first embodiment regarding a driver configured to generate a differential output signal OUT/OUTx which switches between two values, i.e., high level and low level, in a complementary manner. Description will be made in the second embodiment regarding a three-value driver which is capable of generating a signal which switches between voltage levels that correspond to three values.

Figure 7A:
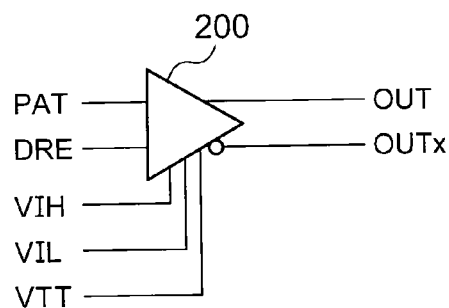
FIGS. 7A and 7B are a diagram showing a symbol of a three-value differential driver and an operation waveform diagram thereof, respectively.
Figure 7B:
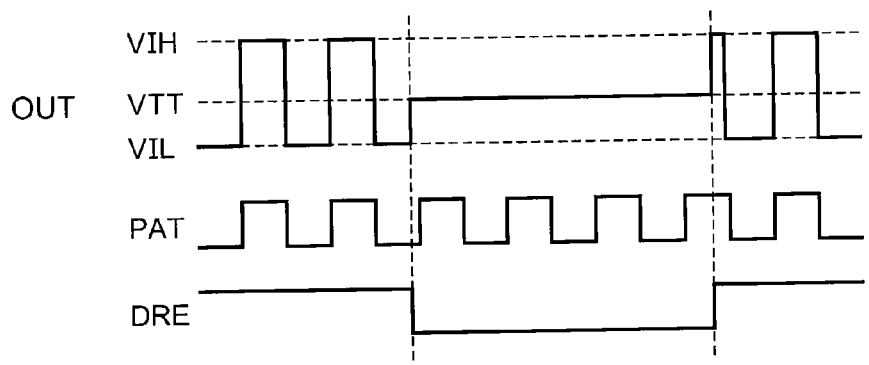

First, description will be made regarding a function of the three-value driver. FIGS. 7A and 7B are, respectively, a diagram showing the symbol for a three-value differential driver circuit 200 and the operation waveform diagram thereof. The differential driver circuit 200 receives a pattern signal PAT and a mode select signal (which will be referred to as the "driver enable signal" hereafter) DRE. When the driver enable signal DRE is asserted (set to high level), the differential driver circuit 200 generates a non-inverted output signal OUT (inverted output signal OUTx) which is set to either high level VIH or low level VIL according to the pattern signal PAT.

On the other hand, when the driver enable signal DRE is negated (set to low level), the non-inverted output signal OUT of the differential driver circuit 200 is set to a third level VTT which is fixed independent of the pattern signal PAT. In this case, the inverted output signal OUTx of the three-value differential driver circuit 200 is also set to a third level VTTx which is fixed independent of the pattern signal PAT.

Figure 8:
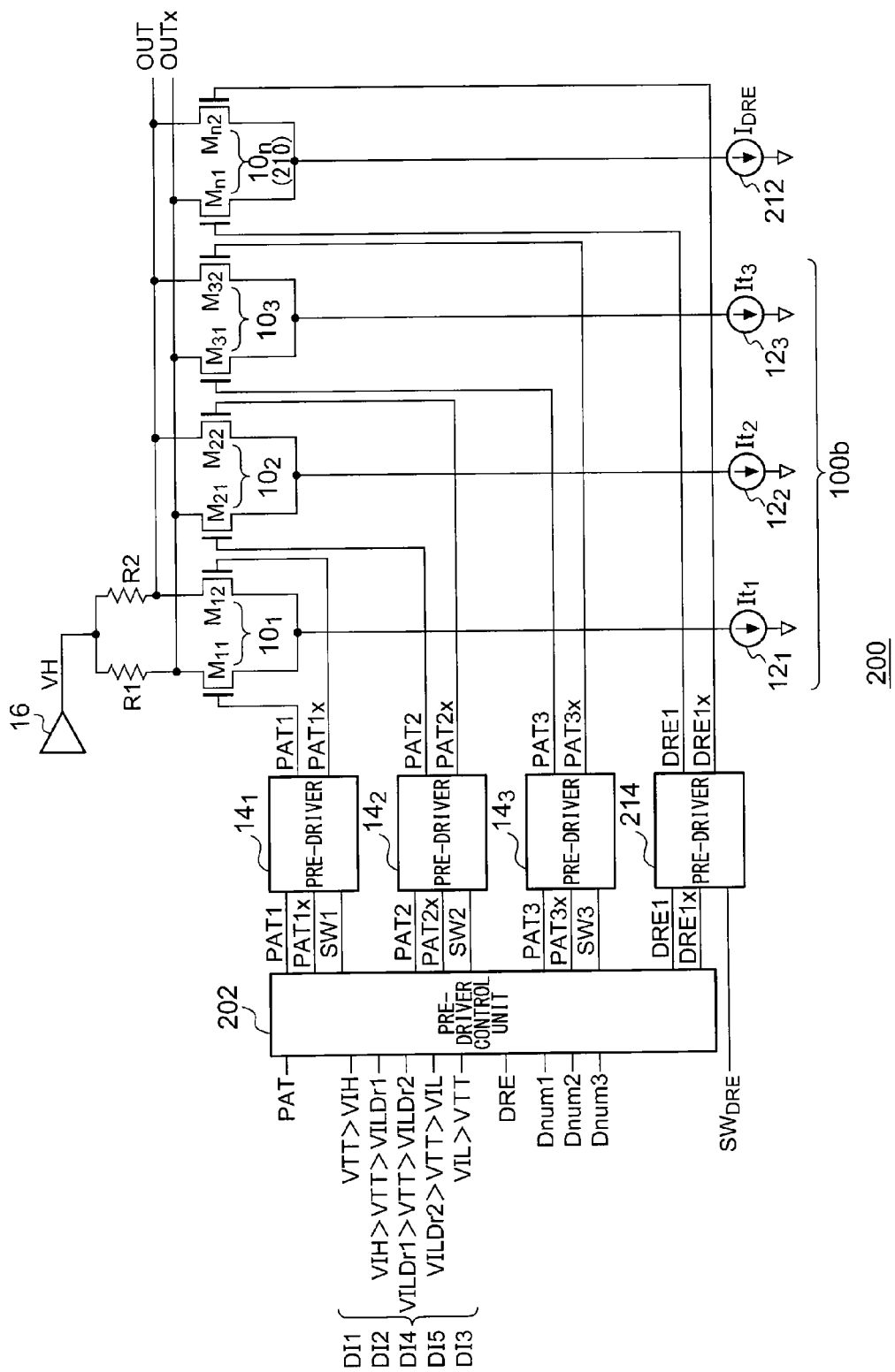
FIG. 8 is a circuit diagram which shows a configuration of a three-value differential driver circuit according to a second embodiment.

FIG. 8 is a circuit diagram which shows a configuration of the three-value differential driver circuit 200 according to the second embodiment. The three-value driver circuit 200 is capable of adjusting the three voltage levels VIH, VIL, and VTT.

The differential driver circuit 200 includes a pre-driver control unit 202, a differential pair 210, a current source 212, and a pre-driver 214, in addition to the configuration of the differential driver circuit 100b shown in FIG. 6. The differential pair 210, the current source 212, and the pre-driver 214 are provided independent of the differential driver circuit 100b. However, the configurations thereof and the operations thereof are the same as those of the differential pair 10, the first current source 12, and the pre-driver 14.

The differential driver circuit 200 receives pattern data PAT, a driver enable signal DRE, first control data Dnum1 through Dnum3, second control data DI1 through DI5, and a control signal SWdre. Description will be made below regarding these signals.

1. Pattern Data PAT

The pattern data PAT is data to be transmitted in the form of a differential output signal OUT/OUTx by the differential driver circuit 200. When PAT=1, OUT is set to VIH, and OUTx is set to VIL. When PAT=0, OUT is set to VIL, and OUTx is set to VIH.

2. Driver Enable Signal DRE

The driver enable signal DRE is a signal which is used to switch the mode between the first mode and the second mode.

(A) When DRE=0, the first mode is selected (terminal driver mode).

In the first mode, the differential driver circuit 200 fixes the non-inverted output signal OUT to the third level VTT, and fixes the inverted output signal OUTx to the third level VTTx, regardless of the level of the pattern signal PAT. Description will be made below focusing only the non-inverted output signal.

(B) When DRE=1, the second mode is selected (pattern driver mode)

In the second mode, the differential driver circuit 200 generates a differential signal OUT/OUTx which switches between the two voltage levels VIH and VIL according to the level of the pattern signal PAT. That is to say, the operation in the second mode is the same as that described in the first embodiment.

3. First Control Data Dnum1 through Dnum3

The first control data Dnum1 through Dnum3 indicate the number #DR of pre-drivers $14_1$ through $14_3$ to be enabled.

When Dnum1=1, #DR is 1, and the pre-driver $14_1$ is set to the enable state.

When Dnum2=1, #DR=2, and the pre-drivers $14_1$ and $14_2$ are set to the enable state.

When Dnum3=1, #DR=3, and the pre-drivers $14_1$ through $14_3$ are set to the enable state.

It should be noted that the data format of the control data Dnum1 through Dnum3 is not restricted in particular. In order to represent the three states, i.e., #DR=1 through 3, a minimum of two bits are required for the control data.

4. Second Control Data DI1 through DI5

The second control data DI1 through DI5 are data based upon which the voltage level VTT is set in the second mode.

5. Control Signal SWdre

The control signal SWdre is a signal used to switch the driver mode between the two-value driver mode and the three-value driver mode. When SWdre=0, the pre-driver 214 is set to the disable state, which turns off the transistors $M_{D1}$ and $M_{D2}$ that form the differential pair 210. Accordingly, in this mode, the differential driver circuit 200 shown in FIG. 8 is equivalent to the differential driver circuit 100b shown in FIG. 6. When SWdre=1, the pre-driver 214 is set to the enable state. In this state, the gate signals DRE1 and DRE1x having complementary levels are supplied to the transistors $M_{D1}$ and $M_{D2}$ that form the differential pair 210. Description will be made below regarding such an arrangement assuming that SWdre is set to 1.

It should be noted that the control signal SWdre for the pre-driver 214 can be controlled according to an instruction from an external circuit. Also, an arrangement may be made in which the pre-driver control unit 202 controls the control signal SWdre. In this case, there is no difference between the differential pair 10 and the differential pair 210.

Next, description will be made regarding the operation of the differential driver circuit 200.

Figure 9A:
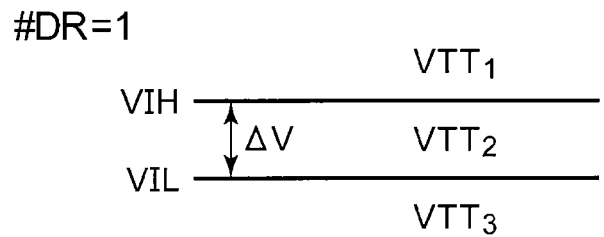
FIGS. 9A through 9C are level diagrams each showing the signal level which changes according to the number of pre-drivers which are in the enable state.
Figure 9B:
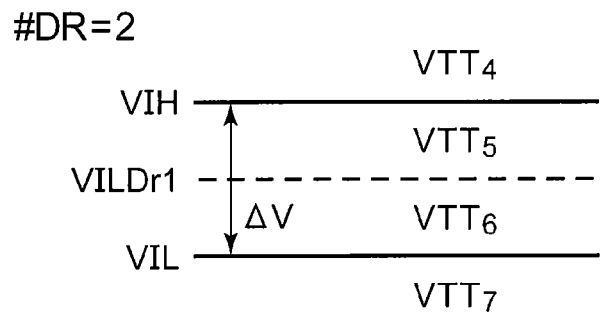
Figure 9C:
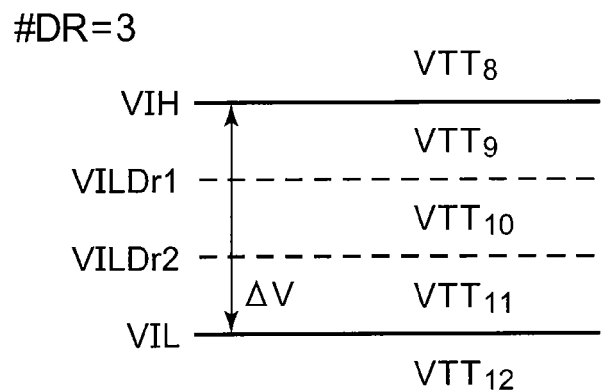

FIGS. 9A through 9C are level diagrams showing the signal level, which changes according to the number #DR of pre-drivers 14 that are in the enable state. FIGS. 10A and 10B are tables showing the level of the signal generated by the pre-driver control unit 202 in the first mode and the second mode, respectively.

FIG. 9A shows the signal level when #DR=1. FIG. 9B shows the signal level when #DR=2, and FIG. 9C shows the signal level when #DR=3. In each level diagram, the solid line VIH represents the voltage level when PAT=1, and the solid line VIL represents the voltage level when PAT=0. The broken line VILDr1 represents the low level voltage when #DR1=1, and the broken line VILDr2 represents the low level voltage when #DR1=2.

As shown in FIGS. 9A through 9C, as the number of pre-drivers that are in the enable state is increased, the amplitude ΔV of the output signal OUT is increased, and the low-level voltage VIL is reduced. This operation is performed in the same way as described in the first embodiment.

Next, description will be made regarding the voltage level of the terminal voltage VTT when the second mode is selected.

As shown in FIG. 9A, when a single pre-driver 14 is in the enable state (#DR=1), the terminal voltage VTT can be set to one of three voltage levels $VTT_1$ through $VTT_3$ which are represented by the following inequalities (I1) through (I3).

$$VTT_1 > VIH \quad (I1)$$

$$VIH > VTT_2 > VIL \quad (I2)$$

$$VIL > VTT_3 \quad (I3)$$

As shown in FIG. 9B, when two pre-drivers 14 are in the enable state (#DR=2), the terminal voltage VTT can be set to one of four voltage levels $VTT_4$ through $VTT_7$ which are represented by the following inequalities (I1) through (I4).

$$VTT_4 > VIH \quad (I1)$$

$$VIH > VTT_5 > VILDr1 \quad (I2)$$

$$VILDr1 > VTT_6 > VIL \quad (I4)$$

$$VIL > VTT_7 \quad (I3)$$

As shown in FIG. 9C, when three pre-drivers 14 are in the enable state (#DR=3), the terminal voltage VTT can be set to one of five voltage levels $VTT_8$ through $VTT_{12}$ which are represented by the following inequalities (I1) through (I5).

$$VTT_8 > VIH \quad (I1)$$

$$VIH > VTT_9 > VILDr1 \quad (I2)$$

$$VILDr1 > VTT_{10} > VILDr2 \quad (I4)$$

$$VILDr2 > VTT_{11} > VIL \quad (I5)$$

$$VIL > VTT_{12} \quad (I3)$$

The control data DI1 through DI5 can be regarded as data which represent the inequalities to be satisfied by the voltage level VTT. That is to say, when DI1=1, the voltage level VTT is generated so as to satisfy the inequality (I1). When DI2=1, the voltage VTT is generated so as to satisfy the inequality (I2). The same can be said of the remaining cases.

Referring to FIG. 10A, the voltage level VTT of the output signal OUT is represented by the following Expression using the current I that flows through the resistor R2 shown in FIG. 8.

$$VTT = VH - R2 \cdot I$$

$$I = \sum_{i=1:n} (PATix \cdot It_i) + DRE1x \cdot I_{DRE}$$

$$= PAT1x \cdot It1 + PST2x \cdot It2 + PAT3x \cdot It3 + DRE1x \cdot I_{DRE}$$

That is to say, as the number of PATix and DRE1x that are set to 1 (high level "H") is increased, the voltage level of the VTT is reduced.

Figure 11:
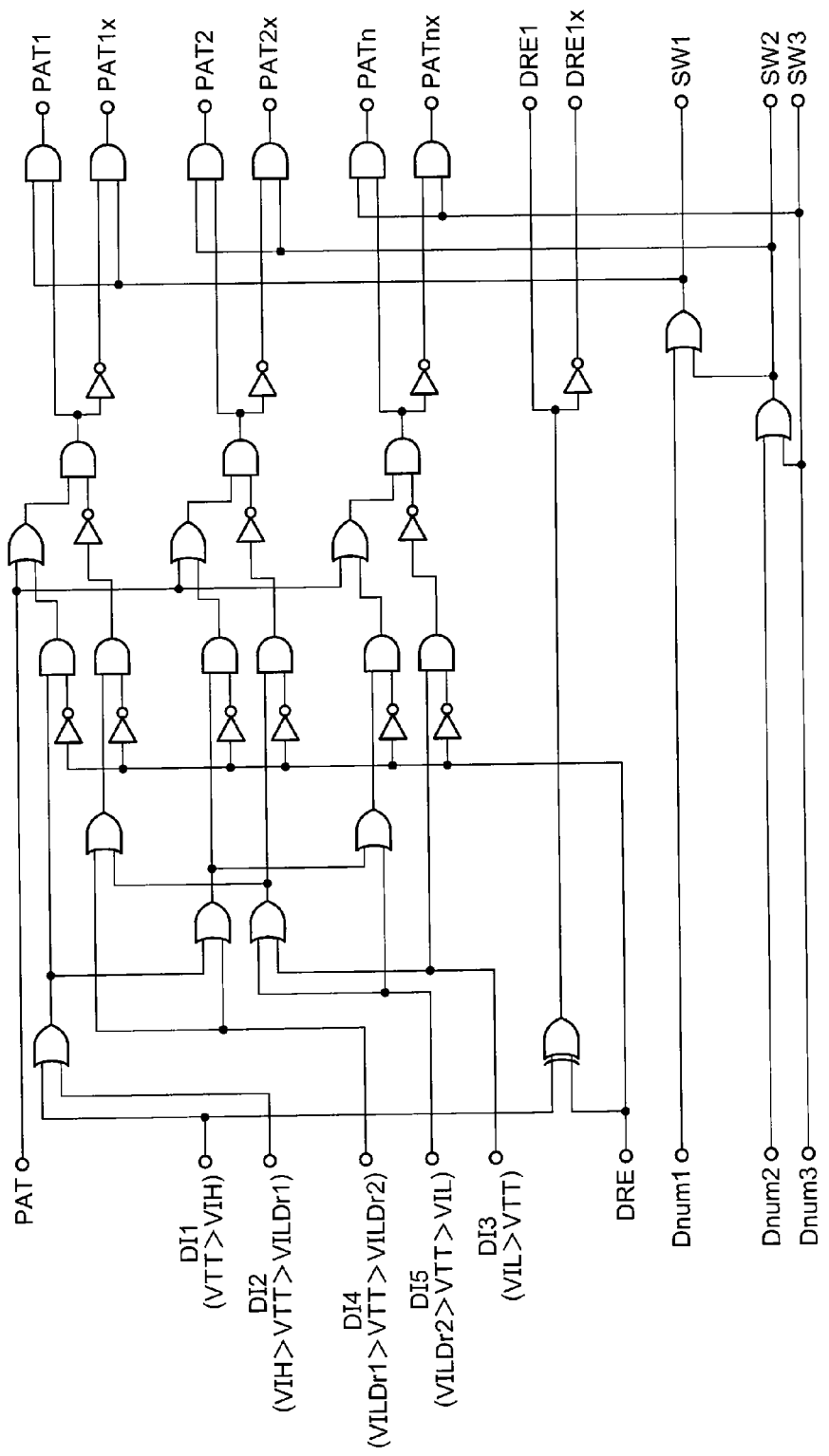
FIG. 11 is a circuit diagram which shows an example configuration of a pre-driver control unit shown in FIG. 8.

FIG. 11 is a circuit diagram which shows an example configuration of the pre-driver control unit 202 shown in FIG. 8. Also, the pre-driver control unit 202 may have other configurations so as to generate the signal level according to the tables shown in FIGS. 10A and 10B, which can be readily conceived by those skilled in this art.

The differential driver circuit 200 shown in FIG. 8 is capable of generating a voltage level which can be switched between the three voltage levels VIH, VIL, and VTT. Furthermore, such an arrangement is capable of adjusting each voltage level.

Figure 12:
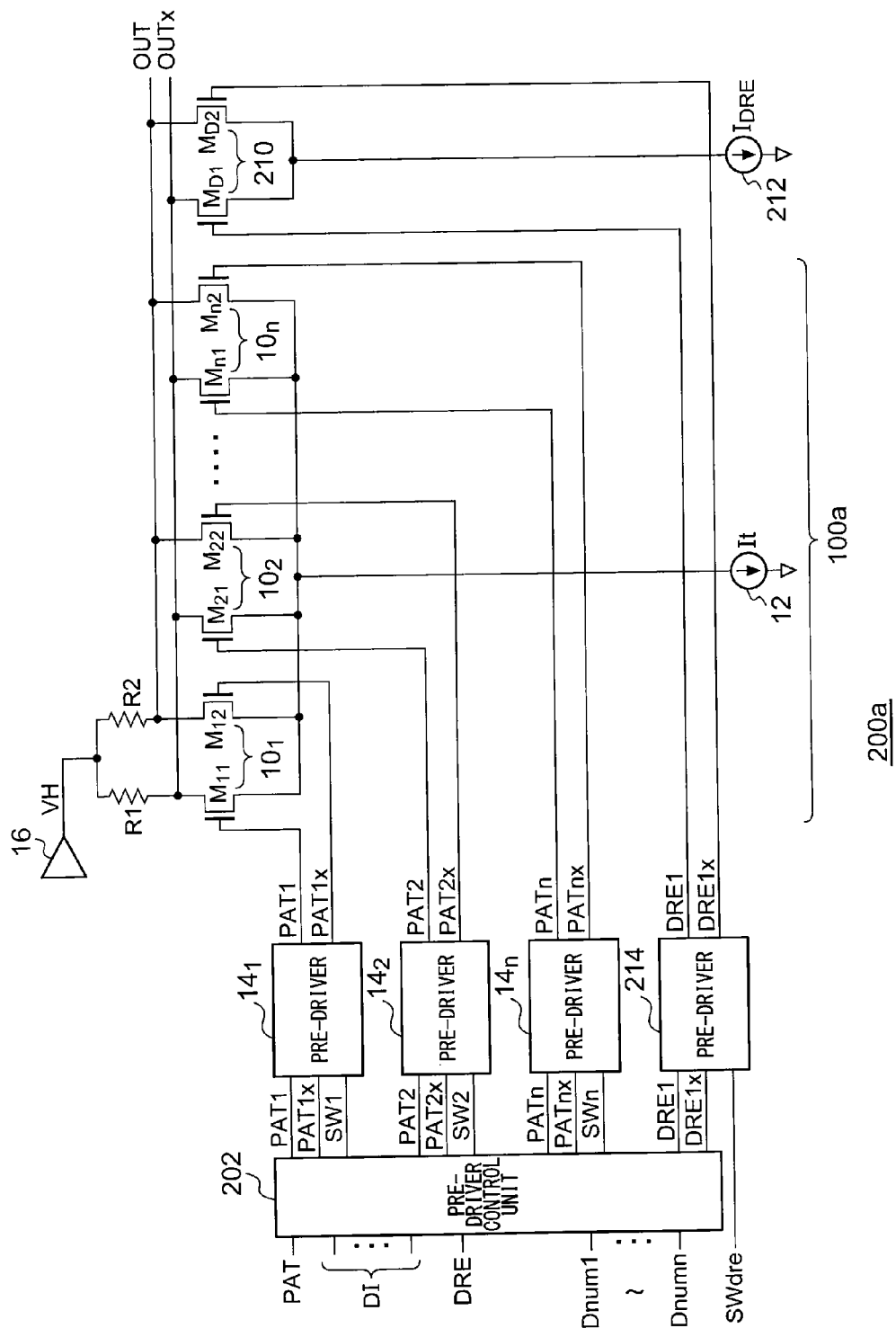
FIG. 12 is a circuit diagram which shows a modification of the differential driver circuit shown in FIG. 8.

FIG. 12 is a circuit diagram which shows a modification of the differential driver circuit shown in FIG. 8. A differential driver circuit 200a shown in FIG. 12 includes the differential driver circuit 100a shown in FIG. 5 instead of the differential driver circuit 100b shown in FIG. 6. The differential driver circuit 200a shown in FIG. 12 is also capable of generating a voltage level which can be switched between the three voltage levels VIH, VIL, and VTT, in the same way as with the differential driver circuit 200 shown in FIG. 8. Furthermore, such an arrangement is also capable of adjusting each voltage level.

Figure 13:
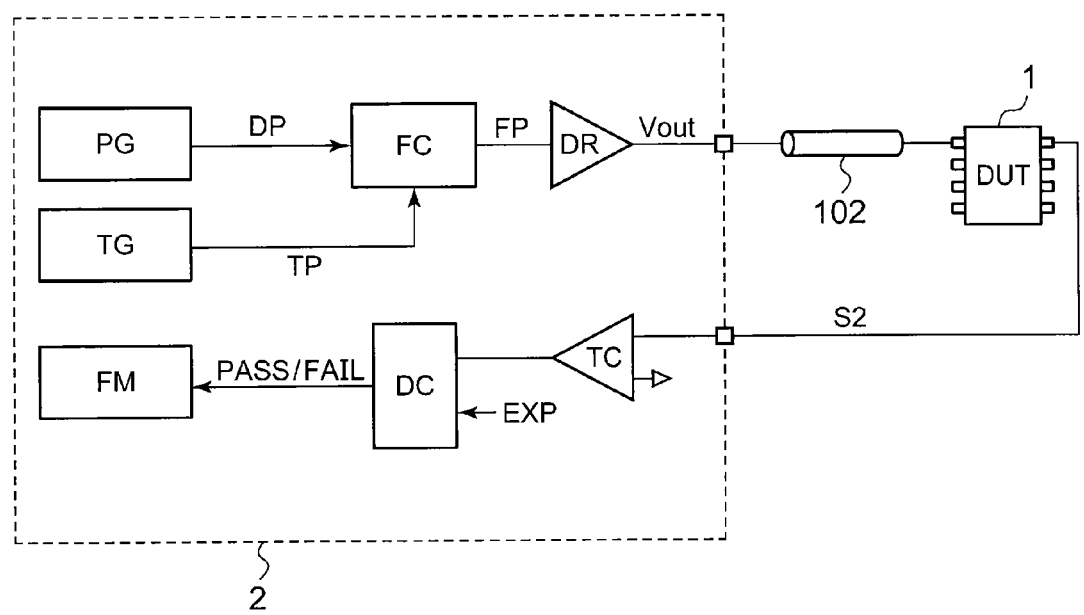
FIG. 13 is a block diagram which shows a configuration of a test apparatus including the differential driver circuit according to the first embodiment or the second embodiment.

Lastly, description will be made regarding an application of the differential driver circuit according to the first embodiment or the second embodiment. FIG. 13 is a block diagram which shows a configuration of a test apparatus 2 including the differential driver circuit according to the embodiment.

The test apparatus 2 primarily includes a pattern generator PG, a timing generator TG, a waveform shaper FC, a driver DR, a timing comparator TC, and a logical comparator DC.

The pattern generator PG generates pattern data DP which defines a test pattern to be supplied to a DUT 1. The timing generator TG generates, with a predetermined cycle (which will be referred to as the "rate cycle $T_{RATE}$" hereafter) based upon the pattern data DP, timing setting data TP which sets the timing of each positive edge and the timing of each negative edge of a signal $V_{out}$ to be supplied to the DUT 1.

The waveform shaper FC receives the pattern data DP and the timing setting data TP, and generates an output signal FP having a value that changes according to the pattern data DP and the timing setting data TP thus received. The driver DR corresponds to the driver circuit 100, 100a, 200, or 200a described in the aforementioned embodiments. The driver DR outputs, to the DUT 1, the voltage $V_{out}$ having a level that corresponds to the signal FP received from the waveform shaper FC.

The timing comparator TC receives a signal S2 output from the DUT 1, and latches the value of the signal S2 at a predetermined timing. The logical comparator DC performs a digital comparison between the output value of the timing comparator TC acquired for each cycle and a corresponding expected value EXP, and generates a pass/fail signal PASS/FAIL which represents the comparison result of whether or not the output value of the timing comparator TC matches the expected value EXP. The pass/fail signal is stored in fail memory FM.

The above is the example configuration of the test apparatus 2. By mounting the differential driver circuit 100 or 200 according to the embodiment on such a test apparatus 2, such an arrangement is capable of adjusting the level of the differential signal to be supplied to the DUT 1 as desired according to the kind of DUT or according to the test item.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A differential driver circuit configured to output a differential signal to a differential transmission line, the differential driver circuit comprising:
    a first output terminal connected to one side of the differential transmission line;
    a second output terminal connected to the other side of the differential transmission line;
    a first resistor arranged such that a predetermined voltage is received via one terminal thereof, and the other terminal thereof is connected to the first output terminal;
    a second resistor arranged such that a predetermined voltage is received via one terminal thereof, and the other terminal thereof is connected to the second output terminal;
    a plurality of differential pairs, each of which comprises a first transistor and a second transistor arranged such that the sources thereof are connected to each other, a drain of the first transistor is connected to the first output terminal and one side of a differential signal to be transmitted is input to a gate of the first transistor, and a drain of the second transistor is connected to the second output terminal and the other side of the differential signal to be transmitted is input to a gate of the second transistor;
    a plurality of first current sources severally arranged according to a plurality of respective differential pairs, and which are each configured to supply a tail current to the corresponding differential pair; and
    a plurality of pre-drivers severally arranged according to the plurality of respective differential pairs, and which are each configured to output gate signals to the gates of the first and second transistors of the corresponding differential pair, to independently switch between an enable state and a disable state, to output, in the enable state, the gate signals according to the differential signal, and to output, in the disable state, gate signals having levels which instruct the first and second transistors of the corresponding differential pair to switch off.

2. A differential driver circuit configured to output a differential signal to a differential transmission line, the differential driver circuit comprising:
    a first output terminal connected to one side of the differential transmission line;
    a second output terminal connected to the other side of the differential transmission line;
    a first resistor arranged such that a predetermined voltage is received via one terminal thereof, and the other terminal thereof is connected to the first output terminal;
    a second resistor arranged such that a predetermined voltage is received via one terminal thereof, and the other terminal thereof is connected to the second output terminal;
    a plurality of differential pairs, each of which comprises a first transistor and a second transistor arranged such that the sources thereof are connected to each other, a drain of the first transistor is connected to the first output terminal and one side of a differential signal to be transmitted is input to a gate of the first transistor, and a drain of the second transistor is connected to the second output terminal and the other side of the differential signal to be transmitted is input to a gate of the second transistor;
    a first current source arranged as a shared current source for the plurality of differential pairs, and configured to supply a tail current to the plurality of differential pairs; and
    a plurality of pre-drivers severally arranged according to the plurality of respective differential pairs, and which are each configured to output gate signals to the gates of the first and second transistors of the corresponding differential pair, to independently switch between an enable state and a disable state, to output, in the enable state, the gate signals according to the differential signal, and to output, in the disable state, gate signals having levels which instruct the first and second transistors of the corresponding differential pair to switch off.

3. A differential driver circuit according to claim 1, wherein the plurality of pre-drivers each comprise:
    a first terminal connected to the gate of the first transistor of the corresponding differential pair;
    a second terminal connected to the gate of the second transistor of the corresponding differential pair;
    a voltage source configured to supply a voltage which can be switched between two voltage values;
    a third resistor arranged such that the voltage output from the voltage source is applied to one terminal thereof, and the other terminal thereof is connected to the first terminal;
    a fourth resistor arranged such that the voltage output from the voltage source is applied to one terminal thereof, and the other terminal thereof is connected to the second terminal;
    a third transistor arranged such that a drain thereof is connected to the first terminal, and one side of a differential signal to be transmitted is input to a gate thereof;
    a fourth transistor arranged such that a drain thereof is connected to the second terminal, the other side of the differential signal to be transmitted is input to a gate thereof, and a source thereof is connected to a source of the third transistor;
    a second current source configured to supply a tail current to the third transistor and the fourth transistor; and
    a switch configured to allow the tail current to pass in the enable state, and to cut off the tail current in the disable state,
    wherein the voltage source is configured to output a predetermined voltage in the enable state, and to output a voltage which instructs the first and second transistors of the corresponding differential pair to switch off in the disable state.

4. A differential driver circuit according to claim 1, wherein the plurality of differential pairs have the same transistor size.

5. A differential driver circuit according to claim 1, wherein the transistor size of the differential pair is weighted in a binary manner in increments of differential pairs.

6. A differential driver circuit comprising:
    a differential driver circuit according to claim 1; and
    a pre-driver control unit configured to generate signals to be supplied to the plurality of pre-driver circuits included in the differential driver circuit,
    wherein the differential driver circuit is configured so as to switch the mode according to a mode select signal, between a first mode in which a fixed voltage is output regardless of a pattern signal, and a second mode in which a differential signal is generated according to the pattern signal.

7. A test apparatus configured to test a device under test, comprising a driver circuit according to claim 1.

8. A differential driver circuit according to claim 2, wherein the plurality of pre-drivers each comprise:
    a first terminal connected to the gate of the first transistor of the corresponding differential pair;

a second terminal connected to the gate of the second transistor of the corresponding differential pair;

a voltage source configured to supply a voltage which can be switched between two voltage values;

a third resistor arranged such that the voltage output from the voltage source is applied to one terminal thereof, and the other terminal thereof is connected to the first terminal;

a fourth resistor arranged such that the voltage output from the voltage source is applied to one terminal thereof, and the other terminal thereof is connected to the second terminal;

a third transistor arranged such that a drain thereof is connected to the first terminal, and one side of a differential signal to be transmitted is input to a gate thereof;

a fourth transistor arranged such that a drain thereof is connected to the second terminal, the other side of the differential signal to be transmitted is input to a gate thereof, and a source thereof is connected to a source of the third transistor;

a second current source configured to supply a tail current to the third transistor and the fourth transistor; and a switch configured to allow the tail current to pass in the enable state, and to cut off the tail current in the disable state, wherein the voltage source is configured to output a predetermined voltage in the enable state, and to output a voltage which instructs the first and second transistors of the corresponding differential pair to switch off in the disable state.

9. A differential driver circuit according to claim 2, wherein the plurality of differential pairs have the same transistor size.

10. A differential driver circuit according to claim 2, wherein the transistor size of the differential pair is weighted in a binary manner in increments of differential pairs.

11. A differential driver circuit according to claim further comprising:

a pre-driver control unit configured to generate signals to be supplied to the plurality of pre-driver circuits included in the differential driver circuit, wherein the differential driver circuit is configured so as to switch the mode according to a mode select signal, between a first mode in which a fixed voltage is output regardless of a pattern signal, and a second mode in which a differential signal is generated according to the pattern signal.

12. A test apparatus configured to test a device under test, comprising a driver circuit according to claim 2.

* * * * *